April 29, 1958 H. E. GOLDSTINE 2,832,847

BEAM POWER AMPLIFIERS

Filed Sept. 21, 1955

INVENTOR.
HALLAN E. GOLDSTINE
BY Charles H. Brown
ATTORNEY

United States Patent Office

2,832,847

Patented Apr. 29, 1958

2,832,847

BEAM POWER AMPLIFIERS

Hallan Eugene Goldstine, Port Jefferson Station, N. Y., assignor to Radio Corporation of America, a corporation of Delaware Application September 21, 1955, Serial No. 535,653

The terminal fifteen years of the term of the patent to be granted has been disclaimed 9 Claims. (Cl. 179—171)

Figures 1, 2:
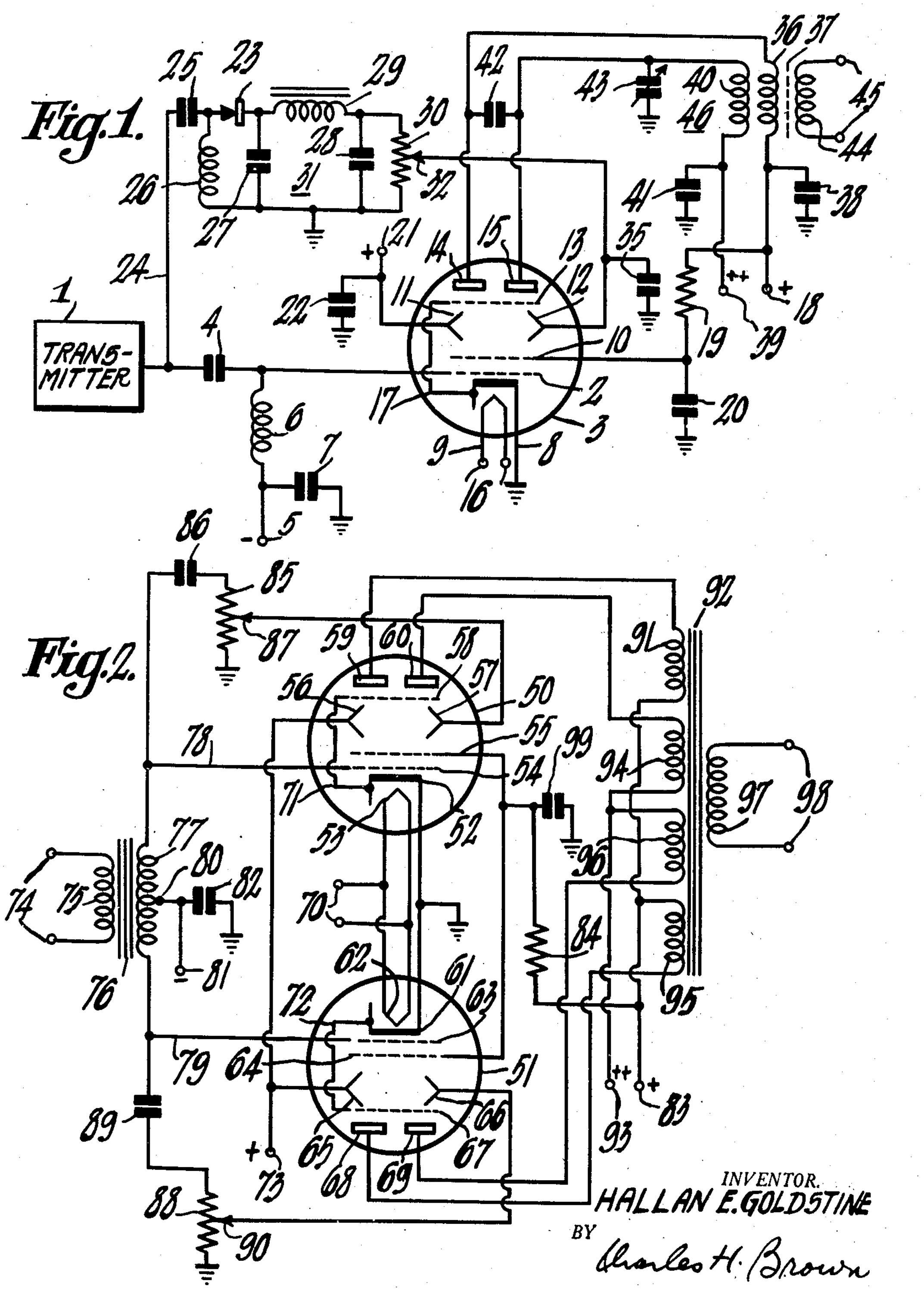

This invention relates to power amplifiers which are adapted to uses in radio and allied arts, and particularly to an evacuated electron discharge amplifying device arranged to operate with a high average plate efficiency.

In the operation of electron discharge power amplifiers, there is always more power going into the plate circuit of the amplifier than is coming out as useful output power. The ratio of useful alternating current output power to the direct current input power to the plate of the amplifier represents the plate efficiency of the amplifier. The difference between the input and output power is usually used up in heating the plate of the amplifier. The heat developed in the plate is radiated to the envelope or bulb of the amplifier and is, in turn, radiated by the envelope to the surrounding air. The amount of the plate output power obtained by the operation of an amplifier, as compared to the amount of the plate input power, is, therefore, directly related to the plate efficiency of the amplifier.

The input power to the plate of an amplifier is the result of plate current times plate voltage. The particular application of an amplifier determines the amount of plate voltage which is necessary to operate the amplifier at a desired degree of efficiency and level of distortion. The maximum plate efficiency, which it is possible to achieve in a given arrangement, is only achieved at the maximum or peak output power, the input signal to the amplifier being at its highest level. When the level of the input signal is reduced, the amplifier will continue to draw current at the same plate voltage. However, the output power is reduced and the amount of input power converted into heat dissipated by the amplifier becomes a larger percentage of the input power. The reduction in output power causes a corresponding lowering of the plate efficiency of the amplifier. The plate efficiency, therefore, varies with the changes in the level of the input signal to the amplifier. When the average plate efficiency is low, a considerable amount of the plate voltage is converted into heat dissipated by the amplifier. In addition to the inefficient expenditure of plate input power, the plate of the amplifier is, of course, subjected to the higher temperature to which the plate is heated.

It is an object of this invention to provide an improved electron discharge amplifier arranged to operate with a high average plate efficiency.

It is a further object of this invention to provide an improved electron discharge amplifier of the beam deflection type arranged to operate with a high average plate efficiency and minimum distortion.

Another object is to enable the operation of a Class B linear amplifier with high plate efficiency throughout the range of high and low levels of the input signal applied to the amplifier.

In general, the invention makes use of a beam power electron discharge device suitable as an amplifier. The device includes a pair of plate elements which are operated at different direct current plate voltages and are connected to the same output circuit. A pair of beam-forming deflection plates are oppositely positioned in the device. A control signal is derived from the input signal to the device and applied to one of the deflection plates. The deflection plates are arranged in the device so that, as the level of the input signal and, therefore, that of the control signal increases above a predetermined level, the electron beam flowing in the device is shifted from the plate with the lower direct current plate voltage to the plate with the higher direct current plate voltage. The control grid of the device is driven in a conventional manner. The device may be operated either Class A or Class B. When the electron beam is caused to shift to the plate having the higher direct current plate voltage, the output power obtained from the device is at or near the maximum value, due to the high level of the input signal. The device operates with or close to the point of the maximum plate efficiency possible. When the level of the input signal and, therefore, that of the control signal, falls below the predetermined level, the electron beam is permitted to shift back to the plate with the lower direct current plate voltage. Since higher direct current plate voltage is not needed at the lower levels of the input signal, distortion in the output signal of the device is kept low. Due to the lower level of the input signal, the output power is reduced. As the plate voltage is also reduced, the device now drawing plate current at a lower direct current plate voltage, the plate efficiency of the device continues at a high level. When greater plate swing or, in other words, a high plate voltage is again needed for a high level signal input, the electron beam is shifted in a smooth manner and the output power is taken from the plate with high direct current plate voltage, and so on. The average plate efficiency of the amplifying device of the invention is as a result, considerably higher than that of the electron discharge amplifiers presently found in the art.

A more detailed description of the invention will be given in connection with the accompanying drawings in which:

Figure 1 is a circuit diagram of a radio frequency linear class B type of amplifier constructed according to the invention, and Figure 2 is a circuit diagram of an audio frequency class B type of amplifier constructed according to the invention.

Referring to Figure 1, there is shown an embodiment of a radio frequency amplifier constructed according to the invention and adapted for use in a radio transmitter. A radio frequency signal is developed by the operation of the transmitter 1, in a manner well known in the art, and fed to the control electrode or grid 2 of an evacuated electron discharge device 3 of the beam deflection pentode type over a path including direct current blocking condenser 4. A bias voltage is applied to the control grid 2 from the negative terminal 5 of a source of unidirectional potential, not shown, over a path including radio frequency choke 6. While the control grid 2 is arranged to be driven in Class B operation, it is to be understood that the invention is not limited to this arrangement. For example class A operation may be used, if desired. The negative terminal 5 is also connected to ground through a radio frequency by-pass condenser 7. The term ground, as used in the specification, is not limited to an actual earth connection but is deemed to include any point of fixed or zero alternating reference potential. The electron discharge device 3, in addition to the control grid 2, includes a grounded cathode 8, a cathode heating element 9, screen grid 10, deflection plates 11 and 12, a suppressor grid 13 and a plate anode assembly comprising a pair of plate elements 14 and 15. The heating element 9 is connected to a source of potential, not shown, via terminals 16. The suppressor grid 13 is maintained at the potential of the cathode 8 by a connecting lead 17. The screen grid 10 is connected to the positive terminal 18 of a source of unidirectional potential, not shown, over a path including series resistor 19 and to ground over a path including radio frequency by-pass condenser 20. The deflection plate 11 is connected to the positive terminal 21 of a source of fixed deflection voltage, not shown, and to ground over a path including radio frequency by-pass condenser 22.

A portion of the output signal of the transmitter 1 is applied to a crystal rectifier detector 23 over a path including lead 24 and direct current blocking condenser 25. The junction of the condenser 25 and rectifier 23 is connected to ground through a radio frequency choke 26. The output signal of rectifier 23 is applied to a condenser input filter circuit 31 comprising condensers 27 and 28 and filter choke 29. The output of the filter circuit 31 is applied across a potentiometer 30, the movable contact 32 of potentiometer 30 being connected to deflection plate 12 of the electron discharge device 3 and to ground over a path including radio frequency by-pass condenser 35.

The plate 14 of electron discharge device 3 is connected to the positive terminal 18 over a path including the primary winding 36 of an output transformer 37, the positive terminal 18 being connected to ground over a path including a radio frequency by-pass condenser 38. The second plate 15 of the electron discharge device 3 is connected to the positive terminal 39 of a source of potential, not shown, over a path including the primary winding 40 of transformer 37, the positive terminal 39 being connected to ground over a path including radio frequency by-pass condenser 41. Different voltages are applied to plates 14 and 15 via terminals 18 and 39, respectively. The voltage applied to plate 14 is of a value necessary to bring about the desired operation of the electron discharge device 3 during periods in which the level of the signal applied to the control grid 2 is low. The voltage applied to plate 15, on the other hand, is of a value necessary to bring about the desired operation of the electron discharge device 3 during periods in which the level of the signal applied to the control grid 2 is high. The plate 14, therefore, is maintained at a relatively low plate voltage, as compared to plate 15 which is maintained at a high plate voltage. The plates 14 and 15 are coupled together by condenser 42 and, in effect, are connected to the same radio frequency output tank circuit 46 comprising primary windings 36 and 40 of transformer 37 and variable condenser 43. The plate coils or windings 36 and 40 may be bifilar wound or may be inserted through the center of a coiled tubing, as is well understood in the operation of high frequency circuits. The secondary winding 44 of transformer 37 is connected to output terminals 45 which, in turn, may be connected to further stages of the transmitter or to an antenna arrangement.

In operation, a portion of the radio frequency signal applied to the control grid 2 of electron discharge device 3 from transmitter 1 is fed to the rectifier 23 via lead 24. The portion of the radio frequency signal is rectified, and an audio frequency direct current signal corresponding to the envelope of the radio frequency signal applied to the input of the rectifier 23 is fed to the filter circuit 31. The filter circuit 31 removes the radio frequency superimposed on the output signal of the rectifier 23, the filtered signal being applied across potentiometer 30. A control signal is developed in accordance with the setting of the movable contact 32 of potentiometer 30 and is applied to the deflection plate 12 of electron discharge device 3. When a radio frequency signal applied to the control grid 2 of electron discharge device 3 is of a low level, the fixed voltage applied to the deflection plate 11 via positive terminal 21 is greater than the voltage applied to deflection plate 12 via the movable contact 32 of potentiometer 30. As a result, the electron beam within the electron discharge device 3 is attracted by the positive field of the deflection plate 11 and the electron beam will flow between the cathode 8 and the plate 14. Output power is fed from the plate 14 to the tuned output circuit 46 in accordance with the level of the input signal to the control grid 2. When the level of the input signal to the control grid 2 is high, however, the voltage developed across potentiometer 30 is also high. The positive voltage applied to deflection plate 12 via movable contact 32 is greater than the fixed voltage applied to deflection plate 11 via terminal 21. The electron beam within the electron discharge device 3 is shifted from plate 14 to plate 15, and the output power is fed from the plate 15 to the tuned output circuit 46. The greater plate swing needed for the higher level of the input signal to the electron discharge device 3 is provided by higher plate voltage applied to plate 15 via positive terminal 39.

The level of the input signal to the electron discharge device 3 at which the electron beam flowing within the device 3 is shifted from plate 14 to plate 15 is determined by the voltage applied to deflection plate 12. The amount of voltage applied to deflection plate 12 is, in turn, determined by the setting of the movable contact 32 of potentiometer 30. By adjusting the movable contact 32, the electron discharge device 3 is operated to draw current from plate 14 at a low direct current plate voltage when the level of the input signal to the control grid 2 is below a predetermined level. On the other hand, when the level of the input signal to the control grid 2 rises above the predetermined level, as determined by the setting of movable contact 32, the electron discharge device 3 is operated to draw current from plate 15 at a high direct current plate voltage.

As previously mentioned, the plate efficiency of an amplifier is defined as the ratio of the output power of the amplifier to input power, the input power equaling the plate current times plate voltage of the amplifier. The maximum plate efficiency is achieved, therefore, only during the periods in which the maximum or peak output power is produced by the amplifier, as determined by the amount of plate voltage. It may be seen that an amplifier constructed according to the invention will be characterized by a high average plate efficiency. During the periods in which the level of the input signal to the electron discharge device 3 is below the level determined by the setting of movable contact 32, the electron discharge device 3 is drawing current from plate 14 at a low plate voltage. The electron discharge device 3 is operating at or near maximum plate efficiency in that the plate voltage is only of a sufficient amount to allow the needed plate swing. The plate voltage is efficiently converted into output power, the amount of plate voltage converted into heat being kept at a minimum. Additional plate voltage is not neeed and would only be converted into heat by the operation of the electron discharge device 3. During the periods in which the level of the input signal to the electron discharge device 3 is above the predetermined level, the electron discharge device 3 is drawing current from plate 15 at a high plate voltage. The electron discharge device 3 is operating at or near the maximum output power possible. The additional voltage obtained by the shift of the electron beam to plate 15 is necessary to allow the greater plate swing brought about by the higher level of the input signal to the electron discharge device 3. As the increase in plate voltage is offset by the increase in output power, the electron discharge device 3 continues to operate at high plate efficiency. By varying the plate voltage in accordance with the level of the input signal applied to the electron discharge device 3, an amplifier having a high average plate efficiency is obtained. An amplifier of the type shown in Figure 1 is especially adaptable for use in a single side band ratio transmitter, particularly in the later stages of the transmitter, where the high average plate efficiency is important to the satisfactory operation of the transmitter.

Referring to Figure 2, there is shown another embodiment of the invention. An audio frequency class B amplifier constructed according to the invention is shown and comprises a pair of electron discharge devices 50 and 51 connected in push-pull operation. The electron discharge devices 50 and 51 are constructed in the same manner as electron discharge device 3 described in connection with Figure 1. Electron discharge device 50 comprises a cathode 52, heating element 53, control grid 54, screen grid 55, deflection plates 56 and 57, suppressor grid 58 and plate elements 59 and 60. Similarly, electron discharge device 51 comprises a cathode 61, heating element 62, control grid 63, screen grid 64, deflection plates 65 and 66, suppressor grid 67 and plate elements 68 and 69. The cathodes 52 and 61 are connected together and to a common ground connection. The heating elements 53 and 62 are connected together and to a source of potential, not shown, via terminals 70. The suppressor grid 58 of electron discharge device 50 is maintained at the potential of cathode 52 by a connecting lead 71. In the same manner, the suppressor grid 67 of electron discharge device 51 is maintained at the potential of cathode 61 by a connecting lead 72. The deflection plates 56 and 65 are each connected to the positive terminal 73 of a source of fixed potential, not shown. The screen grids 55 and 64 are connected together and to the positive terminal 83 of a source of potential, not shown, over a path including series resistor 84 and an audio by-pass condenser 99 connected to ground.

An audio frequency signal produced in any manner well known in the art is applied to the input terminals 74. The signal is applied from the terminals 74 across the primary winding 75 of a transformer 76. One side of the secondary winding 77 of the transformer 76 is connected to the control grid 54 of electron discharge device 50 via lead 78. The other side of the secondary winding 77 is connected to the control grid 63 of electron discharge device 51 via lead 79. A center tap 80 of the secondary winding 77 is connected to the negative terminal 81 of a source of potential, not shown, and to ground over a path including by-pass condenser 82. A grid bias is applied to the control grids 54 and 63 from the negative terminal 81 via leads 78 and 79, respectively. While an audio frequency class B amplifier is shown, it is to be understood that it is given only as one embodiment of the invention. For example, the amplifier shown in Figure 2 may also be adapted for use in an audio frequency class A amplifier. A portion of the signal applied to the control grid 54 of electron discharge device 50 is applied to a potentiometer 85 over a path including direct current blocking condenser 86. The movable contact 87 of potentiometer 85 is connected to deflection plate 57 of electron discharge device 50. Similarly, a portion of the signal applied to the control grid 63 of electron discharge device 51 is applied to a potentiometer 88 over a path including direct current blocking condenser 89. The movable contact 90 of potentiometer 88 is connected to the deflection plate 66 of electron discharge device 51.

The plate 59 of electron discharge device 50 is connected to the positive terminal 83 over a path including the primary winding 91 of an output transformer 92. The plate 60 of electron discharge device 50 is connected to the positive terminal 93 of a source of potential, not shown, over a path including the primary winding 94 of transformer 92. In much the same manner, the plate 68 of electron discharge device 51 is connected to positive terminal 83 over a path including the primary winding 95 of transformer 92, while the plate 69 of electron discharge device 51 is connected to positive terminal 93 over a path including the primary winding 96 of transformer 92. The voltages applied to the plates 59 and 68 via positive terminal 83 are of a lower magnitude than the voltages applied to plates 60 and 69 via positive terminal 93. As described in connection with the electron discharge device 3 shown in Figure 1, the plate 59 of electron discharge device 50 is maintained at a relatively low plate voltage, as compared to plate 60 of electron discharge device 50 which is maintained at a high plate voltage. Similarly, the plate 68 of electron discharge device 51 is maintained at a relatively low plate voltage, as compared to the plate 69 of electron discharge device 51 which it maintained at a high plate voltage. The plate voltage applied to the plates 59 and 68 is sufficient to operate the electron discharge devices 50 and 51, respectively, when the level of the audio frequency signal applied to the respective electron discharge devices 50 and 51 is low. The plate voltage applied to plates 60 and 69, on the other hand, is of an amount necessary to operate the electron discharge devices 50 and 51, respectively, at or near the maximum power output possible when the level of the audio frequency signal applied to the respective electron discharge devices 50 and 51 is high. The secondary winding 97 of transformer 92 is connected to output terminals 98 which are connected to any suitable utilization circuit, not shown.

The push-pull operation of an audio frequency class B amplifier arranged in the manner shown in Figure 2 is well understood in the art and need not be described in detail at this time. Electron discharge device 50 operates during approximately one half of each cycle of the audio frequency input signal appearing across the secondary winding 77 of transformer 76, while electron discharge device 51 operates during the other half of each cycle of the input signal. When the level of the input signal is low, the voltage developed across potentiometer 85 and applied to deflection plate 57 of electron discharge device 50 via movable contact 87 is also low. Similarly, a low voltage, corresponding to the voltage developed across potentiometer 85, is developed across potentiometer 88 and applied to deflection plate 66 of electron discharge device 51 via movable contact 90. The voltage applied to deflection plate 57 is less than the fixed voltage applied to deflection plate 56 of electron discharge device 50 via the positive terminal 73. The electron beam flowing in electron discharge device 50 is attracted by the deflection plate 56, and the electron discharge device 50 draws current from the plate 59 at a low plate voltage. The voltage applied to deflection plate 66 is less than the fixed voltage applied to deflection plate 65 of electron discharge device 51 via the positive terminal 73, and the electron discharge device 51 draws current from the plate 68 at a low plate voltage. The plate voltage applied to electron discharge devices 50 and 51 is sufficient to allow the necessary plate swing in accordance with the low level of audio frequency input signal to the devices. Additional plate voltage is not needed and, because of the low plate voltage, the ratio of output power to input power (plate efficiency) is high.

When the level of the audio frequency input signal is high, however, additional plate voltage is needed to permit a greater plate swing. The voltage applied to deflection plate 57 becomes greater than that applied to deflection plate 56 of electron discharge device 50. The electron beam flowing within the electron discharge device 50 is shifted from plate 59 to plate 60, and the electron discharge device 50 draws current from plate 60 at a high plate voltage. In the same manner, the increased voltage applied to deflection plate 66 of electron discharge device 51 causes the electron beam flowing within electron discharge device 51 to shift from plate 68 to plate 69. The electron discharge device 51 draws current from plate 69 at a high plate voltage. The increase in plate voltage is offset by an increase in power output and, therefore, the plate efficiency of electron discharge devices 50 and 51 continues to be high. By adjusting the movable contacts 87 and 90 of potentiometers 85 and 88, respectively, the electron discharge devices 50 and 51 can be operated to draw current at a low plate voltage during periods in which the level of the audio frequency input signal is below a predetermined level. When the level of the input signal is above the predetermined level, the electron discharge devices 50 and 51 are operated to draw current at a high plate voltage. As was described in connection with the operation of the radio frequency amplifier shown in Figure 1, the plate efficiency of the audio frequency amplifier shown in Figure 2 remains high during periods of either a low level or high level audio frequency input signal. The movable contacts 87 and 90 can be ganged for simultaneous control or can be operated independently of one another, as shown in Figure 2. The setting of the movable contacts 87 and 90 is determined in accordance with the particular application of the audio frequency amplifier and with the type of performance desired. By means of the invention, an audio frequency amplifier can be constructed which is characterized by a high average plate efficiency.

The invention has been described in connection with two levels of operation. In some applications, it may be found desirable to increase the number of levels of operation to provide a greater degree of control. This can be accomplished by increasing the number of plate elements included in an amplifier and by utilizing a more complicated switching arrangement to control the voltages applied to the deflection plates included in the amplifier. The basic operation of such amplifiers including more than two levels of operation, however, remains the same as that of the amplifiers shown in Figures 1 and 2.

Having described the invention, I claim:

1. An amplifier comprising, in combination, an electron discharge device having at least a cathode, a control electrode, a plate assembly, and means for electrically deflecting the flow of electrons in said device, said plate assembly including a multiplicity of elements, a tuned output resonant circuit including a plurality of inductively coupled windings, one of said windings being connected to each of said elements, means for applying different fixed voltages respectively through said windings to said elements, a source of signal voltage, means for applying said signal voltage from said source to said control electrode, means for deriving a control voltage of a magnitude proportional to the level of said signal voltage, means for applying said control voltage to said deflection means, said deflection means being operated in response to said control voltage to selectively cause said electrons to flow to a predetermined one of said elements in accordance with the level of said signal voltage.

2. A power amplifier comprising, in combination, an electron discharge device having at least a cathode, a control electrode, a plate assembly, and first and second deflection plates arranged to direct the flow of electrons in said device, said plate assembly including a multiplicity of elements, means for applying different voltages to said elements, a source of signal voltage, a rectifier, means for applying said signal voltage from said source simultaneously both to said rectifier and to said control electrode, means for deriving from said rectifier a control voltage of a magnitude proportional to the level of said signal voltage, means for applying a fixed voltage to said first deflection plate, means for applying said control voltage to said second deflection plate, said second deflection plate being operated in response to said control voltage to selectively cause said electrons to flow to a predetermined one of said elements in accordance with the level of said signal voltage, and a common output circuit coupled to said multiplicity of elements.

3. An amplifier comprising, in combination, an electron discharge device having at least a cathode, a control electrode, a plate assembly, and means for electrically deflecting the flow of electrons in said device, said plate assembly including a multiplicity of elements, a tuned output resonant circuit including a plurality of inductively coupled windings, one of said windings being connected to each of said elements, means for applying different fixed voltages respectively through said windings to said elements, a source of signal voltage, means for applying said signal voltage from said source to said control electrode, a potentiometer including a movable contact means including said potentiometer for deriving a control voltage of a magnitude proportional to the level of said signal voltage, means for applying said control voltage to said deflection means in accordance with the setting of said movable contact, said deflection means being operated in response to said control voltage to selectively cause said electrons to flow to a predetermined one of said elements in accordance with the level of said signal voltage.

4. An amplifier comprising, in combination, an electron discharge device having at least a cathode, a control electrode, a plate assembly, and first and second deflection plates arranged to direct the flow of electrons in said device, said plate assembly including first and second elements, a tuned output resonant circuit including first and second inductively coupled windings, said first winding being connected to said first element and said second winding being connected to said second element, means for applying a fixed voltage through said first winding to said first element, means for applying a fixed voltage through said second winding to said second element of greater magnitude than that of the voltage applied to said first element, a source of signal voltage, means for applying said signal voltage from said source to said control electrode, means for deriving a control voltage of a magnitude proportional to the level of said signal voltage, means for applying a fixed voltage to said first deflection plate, means for applying said control voltage to said second deflection plate, said second deflection plate being operated in response to said control voltage to selectively cause said electron to flow to a predetermined one of said elements in accordance with the level of said signal voltage.

5. An amplifier comprising, in combination, an electron discharge device having at least a cathode, a control electrode, first and second plate elements, and first and second deflection plates arranged to control the flow of electrons in said device, means for applying a fixed voltage to said first plate element, means for applying a fixed voltage to said second plate element of greater magnitude than that of the voltage applied to said first plate element, said first deflection plate being positioned adjacent said first plate element and said second deflection plate being positioned adjacent said second plate element, a source of signal voltage, means for applying said signal voltage from said source to said control electrode, means for deriving a control voltage of a magnitude directly proportional to the level of said signal voltage, means for applying a fixed voltage to said first deflection plate of a sufficient magnitude to cause said electrons to flow to said first plate element, means for applying said control voltage to said second deflection plate, whereby the flow of said electrons is caused to shift from said first plate element to said second plate element during periods in which the magnitude of said signal voltage is above a predetermined level.

6. An amplifier comprising, in combination, an electron discharge device having at least a cathode, a control electrode, first and second plate elements, and first and second deflection plates arranged to control the flow of electrons in said device, a tuned output resonant circuit including first and second inductively coupled windings, said first winding being connected to said first plate element and said second winding being connected to said second plate element, means for applying a fixed voltage through said first winding to said first plate element, means for applying a fixed voltage through said second winding to said second plate element of greater magnitude than that of the voltage applied to said first plate element, said first deflection plate being positioned adjacent said first plate element and said second deflection plate being positioned adjacent said second plate element, a source of signal voltage, means for applying said signal voltage from said source to said control electrode, a potentiometer including a movable contact, means including said potentiometer for deriving a control voltage of a magnitude directly proportional to the level of said signal voltage, means for applying a fixed voltage to said first deflection plate of a sufficient magnitude to cause said electrons to flow to said first plate element, means for applying said control voltage to said second deflection plate in accordance with the setting of said movable contact, whereby the flow of said electrons is caused to shift from said first plate element to said second plate element during periods in which the magnitude of said signal voltage is above a predetermined level determined by the setting of said movable contact.

7. An amplifier comprising, in combination, an electron discharge device having a cathode, a control grid, a screen grid, a suppressor grid connected to said cathode, first and second plate elements, and first and second deflection plates arranged to control the flow of electrons in said device, a tuned output resonant circuit including first and second inductively coupled windings, said first winding being connected to said first plate element and said second winding being connected to said second plate element, means for applying a fixed voltage through said first winding to said first plate element, means for applying a fixed voltage through said second winding to said second plate element of greater magnitude than that of the voltage applied to said first plate element, means for applying a low voltage to said screen grid relative to the level of the respective voltages applied to said first and said second plate element, said first deflection plate being positioned adjacent said first plate element and said second deflection plate being positioned adjacent said second plate element, a source of signal voltage, means for applying said signal voltage from said source to said control electrode, a potentiometer including a movable contact, means including said potentiometer for deriving a control voltage of a magnitude directly proportional to the level of said signal voltage, means for applying a fixed voltage to said first deflection plate of a sufficient magnitude to cause said electrons to flow to said first plate element, means for applying said control voltage to said second deflection plate in accordance with the setting of said movable contact, whereby the flow of said electrons is caused to shift from said first plate element to said second plate element during periods in which the magnitude of said signal voltage is above a predetermined level determined by the setting of said movable contact.

8. A radio frequency amplifier comprising, in combination, an electron discharge device having a grounded cathode, a control grid, a screen grid, a suppressor grid connected to said cathode, first and second plate elements, and first and second deflection plates arranged to control the flow of electrons in said device, a tuned output resonant circuit including first and second inductively coupled windings, said first winding being connected to said first plate element and said second winding being connected to said second plate element, means for applying a fixed voltage through said first winding to said first plate element, means for applying a fixed voltage through said second winding to said second plate element of a greater magnitude than that of the voltage applied to said first plate element, means for applying a low voltage to said screen grid relative to the level of the respective voltages applied to said plate elements, said first deflection plate being positioned adjacent said first plate element and said second deflection plate being positioned adjacent said second plate element, a source of radio frequency alternating current signal voltage, means for applying said signal voltage from said source to said control grid, a rectifier circuit, means for applying a portion of said signal voltage to said rectifier circuit, said rectifier circuit being operated to convert said portion into an audio frequency direct current control voltage of a magnitude directly proportional to the level of said signal voltage, a potentiometer including a movable contact, means including a filter circuit for applying said control voltage to said potentiometer, means for applying a fixed voltage to said first deflection plate of a sufficient magnitude to cause said electrons to flow to said first plate element, means for applying said control voltage from said potentiometer to said second deflection plate in accordance with the setting of said movable contact, whereby the flow of said electrons is caused to shift from said first plate element to said second plate element during periods in which the magnitude of said signal voltage is above a predetermined level determined by the setting of said movable contact.

9. An audio frequency amplifier comprising, in combination, a pair of electron discharge devices arranged for push-pull operation, each of said devices having at least a cathode, a control grid, first and second plate elements, and first and second deflection plates arranged to control the flow of electrons in said device, means for applying the same fixed voltage to said first plate element of each of said devices, means for applying the same fixed voltage to said second plate element of each of said devices of greater magnitude than that of the voltage applied to said first plate elements, said first deflection plate in each of said devices being positioned adjacent to said first plate element and said second deflection plate in each of said devices being positioned adjacent to said second plate element, a source of audio frequency signal voltage, means for applying said signal voltage from said source to said control grids of said devices, means for applying a fixed voltage to said first deflection plates of sufficient magnitude to cause the electrons to flow in each of said devices to said first plate elements, a first potentiometer including a movable contact, means for applying a portion of said signal voltage applied to said control grid of one of said devices to said first potentiometer to produce a first control voltage of a magnitude directly proportional to the level of said signal voltage, a second potentiometer including a movable contact, means for applying a portion of said signal voltage applied to said control grid of said other device to said second potentiometer to produce a second control voltage of a magnitude directly proportional to the level of said signal voltage, means for applying said first control voltage to said second deflection plate of said one of said devices in accordance with the setting of said movable contact of said first potentiometer, means for applying said second control voltage to said second deflector plate of said other device in accordance with the setting of said movable contact of said second potentiometer, whereby the flow of electrons in each of said devices is caused to shift from said first plate element to said second plate element during periods in which the magnitude of said signal voltage is above a predetermined level, said predetermined level being determined by the settings of said movable contacts of said potentiometers.

References Cited in the file of this patent

UNITED STATES PATENTS

| | | |
|---|---|---|
| 2,107,410 | Dreyer | Feb. 8, 1938 |
| 2,265,311 | Preisach et al. | Dec. 9, 1941 |
| 2,305,617 | Hansell | Dec. 22, 1942 |